(12) United States Patent
Baek et al.

(10) Patent No.: US 8,004,848 B2
(45) Date of Patent: Aug. 23, 2011

(54) STACK MODULE, CARD INCLUDING THE STACK MODULE, AND SYSTEM INCLUDING THE STACK MODULE

(75) Inventors: Seung-Duk Baek, Gyeonggi-do (KR); Mitsuo Umemoto, Gyeonggi-do (KR); Kang-Wook Lee, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 751 days.

(21) Appl. No.: 12/126,313

(22) Filed: May 23, 2008

(65) Prior Publication Data
US 2008/0304242 A1 Dec. 11, 2008

(30) Foreign Application Priority Data
Jun. 7, 2007 (KR) .................. 10-2007-0055729

(51) Int. Cl.
*H01L 23/02* (2006.01)
(52) U.S. Cl. ........ 361/735; 361/762; 361/790; 361/803; 257/621; 257/686; 257/700; 257/778; 174/260; 174/261; 174/262; 174/263; 438/74; 438/106; 438/108
(58) Field of Classification Search ............ 361/735, 361/736, 760–764, 803, 770, 773, 774, 743, 361/795, 804; 257/621, 261, 262, 296, 393, 257/260, 300, 700, 723, 724, 787, 778, 686, 257/685, 737, 738, 698, 706, 707, E25.027, 257/E25.013, E25.141, E23.07, E23.17, E21.505; 438/74, 106–109, 110, 266, 612, 614, 615; 174/260–264
See application file for complete search history.

(56) References Cited

U.S. PATENT DOCUMENTS

| | | | | |
|---|---|---|---|---|
| 5,130,894 | A | * | 7/1992 | Miller .......................... 361/735 |
| 5,527,716 | A | * | 6/1996 | Kusian et al. .................. 438/74 |
| 5,579,207 | A | * | 11/1996 | Hayden et al. ................ 361/790 |
| 5,995,379 | A | * | 11/1999 | Kyougoku et al. ........... 361/803 |
| 6,392,292 | B1 | * | 5/2002 | Morishita ..................... 257/686 |

(Continued)

FOREIGN PATENT DOCUMENTS

JP 06-342874 12/1994

(Continued)

OTHER PUBLICATIONS

English language abstract of Japanese Publication No. 06-342874.

(Continued)

*Primary Examiner* — Michael V Datskovskiy
(74) *Attorney, Agent, or Firm* — Muir Patent Consulting, PLLC

(57) ABSTRACT

Provided are a high reliability stack module fabricated at low cost by using simplified processes, a card using the stack module, and a system using the stack module. In the stack module, unit substrates are stacked with respect to each other and each unit substrate includes a selection terminal. First selection lines are electrically connected to selection terminals of first unit substrates disposed in odd-number layers, pass through some of the unit substrates, and extend to a lowermost substrate of the unit substrates. Second selection lines are electrically connected to selection terminals of second unit substrates disposed in even-number layers, pass through some of the unit substrates, and extend to the lowermost substrate of the unit substrates. The selection terminal is disposed between the first selection lines and the second selection lines.

23 Claims, 5 Drawing Sheets

U.S. PATENT DOCUMENTS

| | | | |
|---|---|---|---|
| 6,451,624 B1 * | 9/2002 | Farnworth et al. | 438/106 |
| 6,469,374 B1 * | 10/2002 | Imoto | 257/686 |
| 6,469,375 B2 * | 10/2002 | Beausoleil et al. | 257/686 |
| 6,492,718 B2 * | 12/2002 | Ohmori | 257/686 |
| 6,501,165 B1 * | 12/2002 | Farnworth et al. | 257/686 |
| 6,740,981 B2 * | 5/2004 | Hosomi | 257/778 |
| 7,352,052 B2 * | 4/2008 | Imoto et al. | 257/622 |
| 7,365,416 B2 * | 4/2008 | Kawabata et al. | 257/686 |
| 7,495,326 B2 * | 2/2009 | Rinne | 257/686 |
| 7,586,183 B2 * | 9/2009 | Kawabata et al. | 257/686 |

FOREIGN PATENT DOCUMENTS

| | | |
|---|---|---|
| JP | 2001-024151 | 1/2001 |
| KR | 2002-0066095 | 8/2002 |

OTHER PUBLICATIONS

English language abstract of Japanese Publication No. 2001-024151.

English language abstract of Korean Publication No. 2002-0066095.

\* cited by examiner

STACK MODULE, CARD INCLUDING THE STACK MODULE, AND SYSTEM INCLUDING THE STACK MODULE

CROSS-REFERENCE TO RELATED PATENT APPLICATIONS

This application claims priority under 35 USC §119 to Korean Patent Application No. 10-2007-0055729, filed on Jun. 7, 2007 in the Korean Intellectual Property Office, the disclosure of which is incorporated herein in its entirety by reference.

BACKGROUND

1. Technical Field

The present invention relates to a semiconductor device, and more particularly, to a stack module in which unit substrates are stacked, a card including the stack module, and a system including the stack module.

2. Description of the Related Art

As integration of semiconductor products increases, stacked structures of a plurality of semiconductor packages or a plurality of semiconductor chips are increasingly being utilized. In stacked structures, semiconductor packages or semiconductor chips are electrically connected, and thus, can be selectively or commonly accessed using an external terminal.

For example, JP 2001-024151 discloses a semiconductor device in which a plurality of chips are stacked. Those chips can be connected using surface-select pads, rear surface-select pads, and vias.

Japanese Patent Application No. hei6-342874 discloses a stack package. Specifically, a plurality of packages are stacked, and, in each package, surface interconnection lines and rear interconnection lines are disposed so as to be shifted by two pitch lengths from each other.

However, with respect to the stack structures described above, it is very difficult and expensive to form pads or interconnections on both surfaces of a semiconductor chip. Particularly, when a semiconductor chip is warped, due to thermal transients for example, the reliability of the connection between a surface pad and a rear pad can decrease. In addition, to ensure that surface and rear interconnection lines are shifted toward each other, vias should be slanted in semiconductor packages, which may make the manufacturing process more complex.

SUMMARY

The present invention provides a stack module suitable for a low cost, simple, and reliable manufacturing process. The present invention also provides a card including the stack module and a system including the stack module.

According to an aspect of the present invention, there is provided a stack module. A plurality of unit substrates are stacked with respect to each other and each unit substrate includes a selection terminal. First selection lines are electrically connected to selection terminals of first unit substrates disposed on an odd-number layer, pass through some of the unit substrates, and extend to the lowermost substrate of the unit substrates. Second selection lines are electrically connected to selection terminals of second unit substrates disposed on an even-number layer, pass through some of the unit substrates, and extend to the lower most substrate of the unit substrates. The selection terminal is disposed between the first selection lines and the second selection lines.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
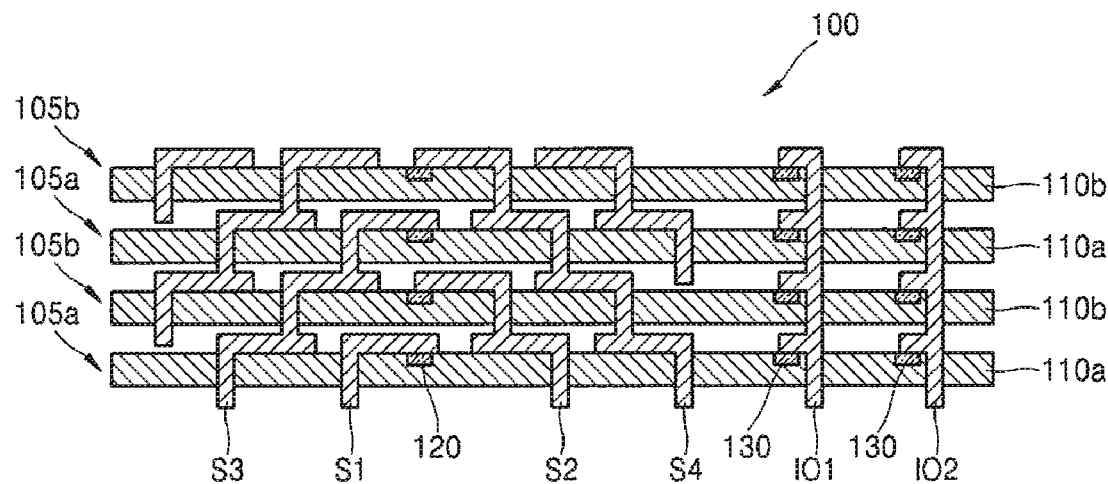
FIG. 1 shows a cross-sectional view of a stack module according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art. In the drawings, elements of the invention are exaggerated for clarity.

FIG. 1 shows a cross-sectional view of a stack module 100 according to an embodiment of the present invention.

Referring to FIG. 1, the stack module 100 may include a stack structure of first unit modules 105a and second unit modules 105b. For example, the first unit modules 105a may be disposed in odd-number layers and the second unit modules 105b may be disposed in even-number layers. Each of the first unit modules 105a includes a first unit substrate 110a and an interconnection structure thereof. Each of the second unit modules 105b includes a second unit substrate 110b and an interconnection structure thereof.

The first unit substrates 110a and the second unit substrates 110b can be alternately stacked with respect to each other. For example, a first unit substrate 110a is disposed first, then a second unit substrate 110b is disposed, and then another first unit substrate 110a, and so on in a sequential alternating order. Alternatively, unlike the structure illustrated in FIG. 1, a second unit substrate 110b is disposed first, then a first unit substrate 110a is disposed, and then another second unit substrate 110*b*, and so on in a sequential alternating order. The number of the first and second unit substrates 110*a* and 110*b* may be appropriately determined and does not limit the scope of the present invention. Therefore, the total number of the first and second unit substrates 110*a* and 110*b* can be a predetermined natural number N.

Each first and second unit substrate 110*a* and 110*b* may include a selection terminal 120. For example, the selection terminal 120 can be connected to an internal circuit of each first and second unit substrate 110*a* and 110*b*, and thus can be used to choose between one or more first and second unit substrates 110*a* and 110*b*. The first and second unit substrates 110*a* and 110*b* can further include one or more input and output terminals 130. The input and output terminals 130 can be used to commonly transmit data to or receive data from the first and second unit substrates 110*a* and 110*b*.

For example, each first and second unit substrate 110*a* and 110*b* may include a semiconductor chip. In this case, the first and second unit substrates 110*a* and 110*b* can be a part of a semiconductor substrate including a semiconductor device that forms an internal circuit. A single semiconductor chip may be a single die separated from a semiconductor substrate or semiconductor wafer. A semiconductor device can include a memory device or a logic device. Alternatively, the first and second unit substrates 110*a* and 110*b* can be a printed circuit board (PCB) on which a semiconductor device is mounted.

First selection lines S1 and S3, second selection lines S2 and S4 and/or one or more input and output lines IO1 and IO2 can form an interconnection structure of first and second unit modules 105*a* and 105*b*. However, the interconnection structure is introduced as an example only, and the scope of the present invention is not limited to this structure.

Each of the first selection lines S1 and S3 can be electrically connected to the selection terminal 120 of each first unit substrate 110*a*. For example, the first selection lines S1 and S3 can extend from the selection terminal 120 to the lowermost substrate of the first and second unit substrates 110*a* and 110*b* by penetrating through portions of the first and second unit substrates 110*a* and 110*b*. The first selection lines S1 and S3 can be used to select the first unit substrates 110*a*. For example, the first unit substrate 110*a* stacked in a first layer can be accessed using the first selection line S1 On the other hand, the first unit substrate 110*a* stacked in a third layer can be accessed using the first selection line S3.

Each of the second selection lines S2 and S4 can be electrically connected to the selection terminal 120 of each second unit substrate 110*b*. For example, the second selection lines S2 and S4 can extend from the selection terminal 120 to the lowermost substrate of the first and second unit substrates 110*a* and 110*b* by penetrating through portions of the first and second unit substrates 110*a* and 110*b*. The second selection lines S2 and S4 can be separately used to select the second unit substrates 110*b*. For example, the second unit substrate 110*b* stacked in a second layer can be accessed using the second selection line S2. On the other hand, the second unit substrate 110*b* stacked in a fourth layer can be accessed using the second selection line S4.

The first selection lines S1 and S3 may face the second selection lines S2 and S4 in such a manner that the selection terminal 120 is interposed between the first selection lines S1 and S3 and the second selection lines S2 and S4. For example, as illustrated in FIG. 1, the first selection lines S1 and S3 can be disposed at the left side of the selection terminal 120, and the second selection lines S2 and S4 can be disposed at the right side of the selection terminal 120. Alternatively, unlike the structure illustrated in FIG. 1, if locations of the first unit substrates 110*a* and second unit substrates 110*b* are reversed, the first selection lines S1 and S3 can be disposed at the right side of the selection terminal 120, and the second selection lines S2 and S4 can be disposed at the left side of the selection terminal 120.

For example, the first selection lines S1 and S3 and the second selection lines S2 and S4 can extend from respective selection terminals 120 in an opposite direction to each other in a step-wise manner. The first selection lines S1 and S3 and the second selection lines S2 and S4 extend from respective selection terminals 120 downwards from the first and second unit substrates 110*a* and 110*b* in a step-wise manner. Specifically, the first selection lines S1 and S3 and the second selection lines S2 and S4 can include portions which are horizontal to the first unit substrates 110*a* and the second unit substrates 110*b* and portions which are perpendicular to the first unit substrates 110*a* and the second unit substrates 110*b*. Therefore, the higher the location of the selection terminals 120 or the larger the number of first unit substrates 110*a* and second unit substrates 110*b*, the farther the distance between the selection terminals 120 and ends of the first selection lines S1 and S3 or ends of the second selection lines S2 and S4 connected to the selection terminals 120.

According to another embodiment of the present invention, the first selection lines S1 and S3 and the second selection lines S2 and S4 can be shared by at least two selection terminals 120 respectively. In this regard, the number of first selection lines S1 and S3 or second selection lines S2 and S4 can be smaller than the number of first unit substrates 110*a* or second unit substrates 110*b*. Therefore, one of the first selection lines S1 and S3 can simultaneously access more than one of the first unit substrates 110*a*, and one of the second selection lines S2 and S4 can simultaneously access more than one of the second unit substrates 110*b*. In this regard, the first unit substrates 110*a* or the second unit substrates 110*b* may be required to have the same kind of semiconductor chips.

Input and output lines IO1 and IO2 can be commonly connected to input and output terminals 130 of the first and second unit substrates 110*a* and 110*b*. The input and output lines IO1 and IO2 can be shared by the first and second unit substrates 110*a* and 110*b*.

In the stack module 100, ends of the first and second unit substrates 110*a* and 110*b* can align with each other. For example, when the first and second unit substrates 110*a* and 110*b* include the same kind of semiconductor chip, the selection terminals 120 can be vertically aligned. Furthermore, portions of the first selection lines S1 and S3 and second selection lines S2 and S4 which pass through the first unit substrates 110*a* and the second unit substrates 110*b*, that is, vertical portions perpendicular to the first unit substrates 110*a* and the second unit substrates 110*b*, can be vertically aligned.

In the present embodiment, the structure of the stack module 100 can be obtained using only two kinds of interconnection structures. For example, the first unit modules 105*a* can have one kind of identical interconnection structure, and the second unit modules 105*b* can have another kind of identical interconnection structure. Therefore, the manufacturing costs can be substantially decreased compared to when each first and second unit module 105*a* and 105*b* includes different interconnection structures.

Figure 2:
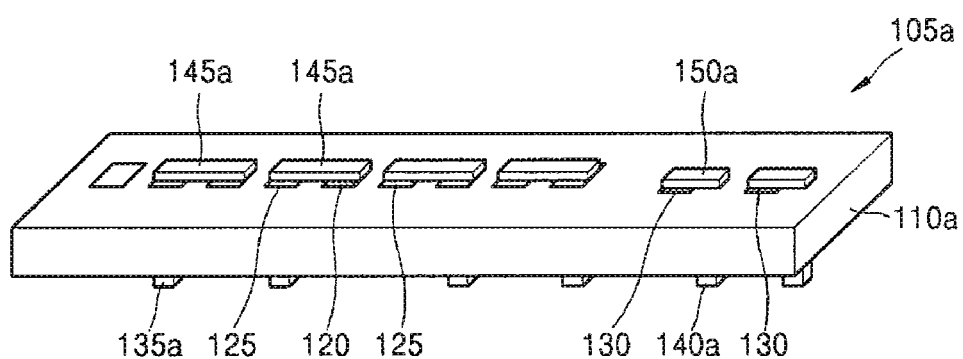
FIG. 2 shows a perspective view of an example of a first unit module alternatively arranged in the stack module of FIG. 1.
Figure 3:
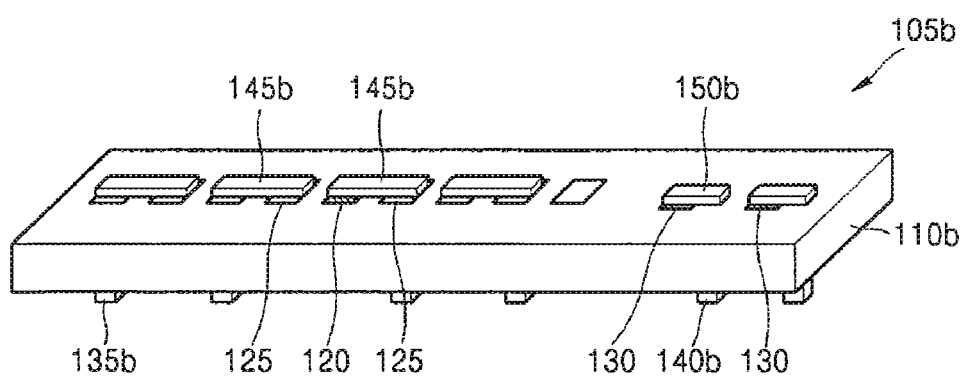
FIG. 3 shows a perspective view of an example of a second unit module alternatively arranged in the stack module of FIG. 1.

FIG. 2 shows a perspective view of an example of the first unit module 105*a* alternatively arranged in the stack module of FIG. 1, and FIG. 3 shows a perspective view of an example of the second unit module 105*b* alternatively arranged in the stack module of FIG. 1.

Referring to FIG. 2, selection pads 125 can be disposed at both sides of the selection terminal 120 on the first unit substrate 110a. The selection terminal 120 can be connected to an internal circuit of the first unit substrate 110a, and the selection pads 125 may not be connected to an internal circuit. First through-hole electrodes 135a can pass through the first unit substrate 110a and can be disposed at both sides of the selection terminal 120. For example, the first through-hole electrodes 135a can pass through a portion of the selection pad 125, and in the present embodiment, the first through-hole electrodes 135a are disposed in a portion of the selection pads 125.

In the stack module 100, the number of first through-hole electrodes 135a can be the same or greater than the number of first and second unit substrates 110a and 110b. Therefore, when the number of first and second unit substrates 110a and 110b is N, the number of first through-hole electrodes 135a can be N or more. For example, the number of selection pads 125 can be double the number of first through-hole electrodes 135a, and thus, can be 2N.

For example, when N is an even number, N/2 first through-hole electrodes 135a can be disposed at both sides of the selection terminal 120. On the other hand, when N is an odd number, (N+1)/2 first through-hole electrodes 135a can be disposed at both sides of the selection terminal 120. However, the scope of the present invention is not limited to these examples. That is, a different number of first through-hole electrodes 135a can be disposed at both sides of the selection terminal 120.

The first redistribution layers 145a can be disposed on the first unit substrates 110a in such a manner that the first redistribution layers 145a are electrically connected to the first through-hole electrodes 135a. In another embodiment, the first redistribution layers 145a can be disposed below the first unit substrates 110a. For example, the first redistribution layers 145a can extend from the first through-hole electrodes 135a toward the selection terminal 120 by a predetermined distance. Therefore, at the left side of the selection terminal 120, the first redistribution layers 145a extend from the first through-hole electrodes 135a toward the selection terminal 120, and at the right side of the selection terminal 120, the first redistribution layers 145a can extend from the through-hole electrodes 135a toward the selection terminal 120, The number of first redistribution layers 145a may be the same as the number of first through-hole electrodes 135a, and thus, can be N or more. For example, among the first redistribution layers 145a, one first redistribution layer 145a to the immediate left of the selection terminal 120 can directly contact the selection terminal 120.

Third through-hole electrodes 140a can pass through the first unit substrates 110a and can be connected to the input and output terminals 130. For example, third redistribution layers 150a can be disposed on the first unit substrates 110a such that the third through-hole electrodes 140a are connected to the input and output terminals 130.

Referring to FIG. 3, each of second through-hole electrodes 135b can be disposed between adjacent first through-hole electrodes 135a. Therefore, the first through-hole electrodes 135a and the second through-hole electrodes 135b can be aligned in a zigzag configuration. For example, the first through-hole electrodes 135a can be disposed on every other selection pad 125, and the second through-hole electrodes 135b can be disposed on the selection pads 125 between the first through-hole electrodes 135a. In this case, the second through-hole electrodes 135b are disposed at the central portion between adjacent first through-hole electrodes 135a.

The number of second through-hole electrodes 135b can be the same as the number of first through-hole electrodes 135a. Therefore, the number of second through-hole electrodes 135b can be N or more. For example, if N is an even number, N/2 second through-hole electrodes 135b can be disposed at both sides of the selection terminal 120. On the other hand, if N is an odd number, (N+1)/2 second through-hole electrodes 135b can be disposed at both sides of the selection terminal 120. However, the scope of the present invention is not limited to these examples. That is, a different number of second through-hole electrodes 135b can be disposed at both sides of the selection terminal 120.

The second redistribution layers 145b can be disposed on the second unit substrates 110b in such a manner that the second redistribution layers 145b are electrically connected to the second through-hole electrodes 135b. According to another embodiment, the second redistribution layers 145b can be disposed below the second unit substrates 110b. For example, the second redistribution layers 145b can extend from the second through-hole electrodes 135b toward the selection terminal 120 by a predetermined distance. Therefore, at the left side of the selection terminal 120, the second redistribution layers 145b extends from the second through-hole electrodes 135b toward the selection terminal 120. On the other hand, at the right side of the selection terminal 120, the second redistribution layers 145b can extend from the second through-hole electrodes 135b toward the selection terminal 120.

The number of second redistribution layers 145b can be the same as the number of second through-hole electrodes 135b. Therefore, the number of second redistribution layers 145b can be N or more. For example, among the second redistribution layers 145b, one second redistribution layer 145b to the immediate left of the selection terminal 120 at the right side of the selection terminal 120 can directly contact the selection terminal 120.

Fourth through-hole electrodes 140b can pass through the second unit substrates 110b and can be connected to input and output terminals 130. For example, fourth redistribution layers 150b can be disposed on the second unit substrates 110b in such a manner that the fourth through-hole electrodes 140b are connected to the input and output terminals 130. The third through-hole electrodes 140a and the fourth through-hole electrodes 140b can be vertically aligned through the first and second unit substrates 110a and 110b and can have substantially the same structure. Likewise, the third redistribution layers 150a and the fourth redistribution layers 150b can be vertically aligned on the first and second unit substrates 110a and 110b and can have the same structure.

Referring to FIGS. 1 through 3, two first unit modules 105a and two second unit modules 105b can be alternatively stacked to form the stack module 100. Specifically, one first selection line S1 can include a connection structure of the first through-hole electrodes 135a and the first redistribution layers 145a. The first selection line S3 can include the connection structure of one first through-hole electrode 135a, one first redistribution layer 145a, one second through-hole electrode 135b, one second redistribution layer 145b, another first through-hole electrode 135a, and another first redistribution layer 145a.

The second selection line S2 includes a connection structure of one first through-hole electrode 135a, one first redistribution layer 145a, one second through-hole electrode 135b, and one second redistribution layer 145b. The second selection line S4 includes a connection structure of one first through-hole electrode 135a, one first redistribution layer 145a, one second through-hole electrode 135b, one second redistribution layer 145b, one first through-hole electrode 135a, one first redistribution layer 145a, one second through-hole electrode 135b, and one second redistribution layer 145b.

The input and output lines IO1 and IO2 can include a connection structure of a repeating unit of the third through-hole electrodes 140a, the third redistribution layers 150a, the fourth through-hole electrodes 140b, and the fourth redistribution layers 150b. The input and output lines IO1 and IO2 can include a vertical connection structure of the third through-hole electrodes 140a and the fourth through-hole electrodes 140b.

In the stack module 100 according to the present embodiment, the first and second redistribution layers 145a and 145b can be formed on only one surface of the first and second unit substrates 110a and 110b, that is, first and second redistribution layers 145a and 145b can be formed on or below the first and second unit substrates 110a and 110b. These features can be compared to the surface-select pad and rear-select pad disclosed in Japanese Patent Application No. 2001-024151, and to the surface and rear interconnection lines disclosed in Japanese Patent Application No. hei6-342874. Therefore, the stack module 100 can be fabricated at low cost using simplified processes. Furthermore, even when the first and second unit substrates 110a and 110b are warped, the first selection lines S1 and S3 and second selection lines S2 and S4 can retain high connection reliability.

Figure 4:
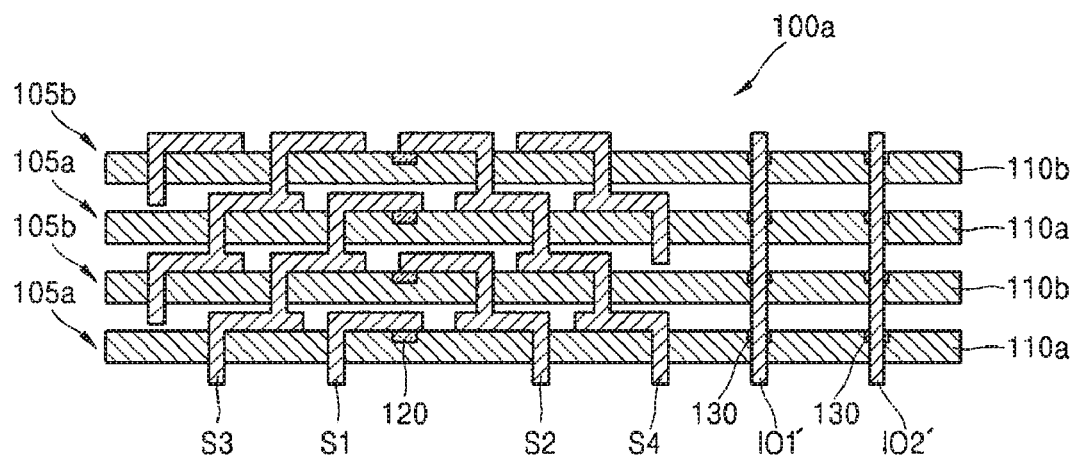
FIG. 4 shows a cross-sectional view of a stack module according to another embodiment of the present invention.

FIG. 4 shows a cross-sectional view of a stack module 100a according to another embodiment of the present invention.

Referring to FIG. 4, input and output lines IO1' and IO2' can vertically pass through first and second unit substrates 110a and 110b and input and output terminals 130. For example, the third through-hole electrode 140a and the fourth through-hole electrode 140b illustrated in FIGS. 2 and 3 can be modified in such a manner that the third through-hole electrode 140a and the fourth through-hole electrode 140b directly pass through the first and second unit substrates 110a and 110b and the input and output terminals 130. Therefore, the input and output lines O1' and IO2' of the stack module 100a can be further simplified from the input and output lines IO1 and IO2 of the stack module 100 of FIG. 1.

Figure 5:
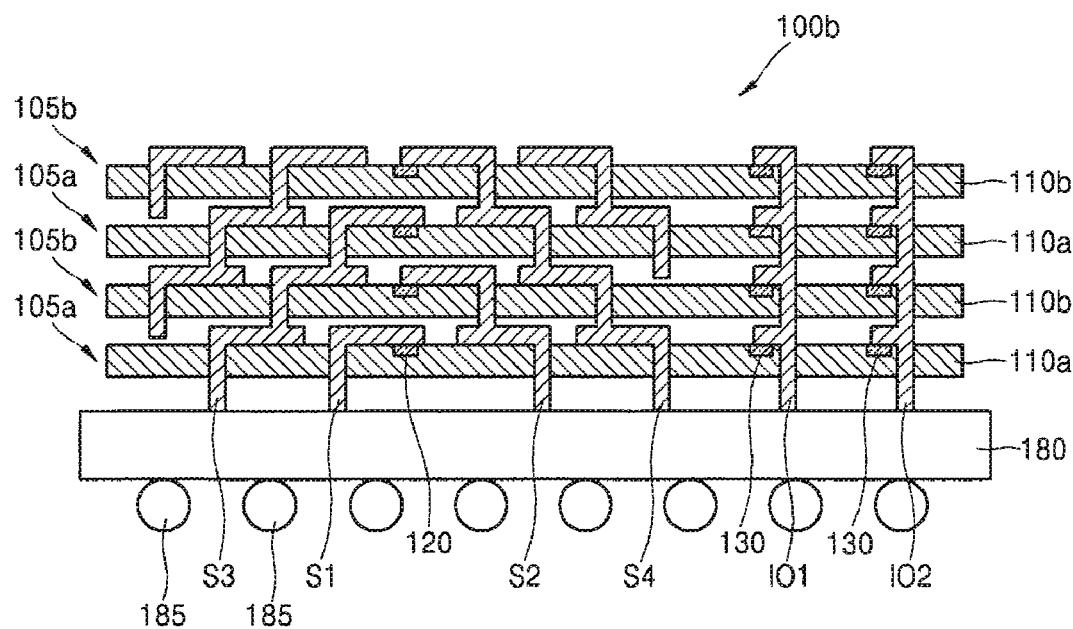
FIG. 5 shows a cross-sectional view of a stack module according to another embodiment of the present invention.

FIG. 5 shows a cross-sectional view of a stack module 100b according to another embodiment of the present invention.

Referring to FIG. 5, the stack module 100 of FIG. 1 can be mounted on a package substrate 180. The first selection lines S1 and S3, the second selection lines S2 and S4, and the input and output lines IO1 and IO2 can be connected to a circuit of the package substrate 180. A plurality of conductive bumps 185 can be disposed below the package substrate 180. For example, the package substrate 180 can include a printed circuit board (PCB.) The conductive bumps 185 can be an external terminal of the stack module 100b, and for example, can be solder balls.

In the present embodiment, the stack module 100 of FIG. 1 can be replaced with the stack module 100a of FIG. 4.

Figure 6:
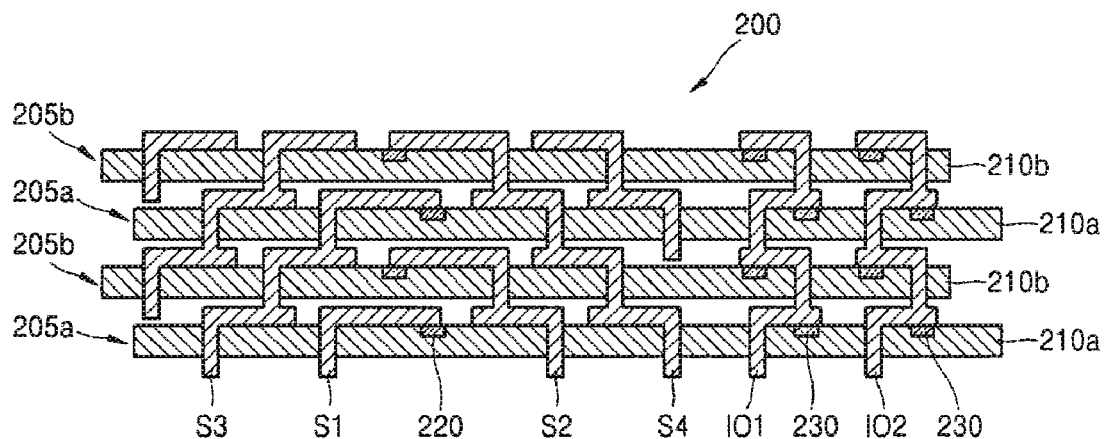
FIG. 6 shows a cross-sectional view of a stack module according to another embodiment of the present invention.

FIG. 6 shows a cross-sectional view of a stack module 200 according to another embodiment of the present invention. The stack module 200 of FIG. 6 may partially correspond to the stack module 100 of FIG. 1. Therefore, a description of the elements in the present embodiment similar to the elements in the stack module 100 will not be given.

Referring to FIG. 6, a stack module 200 can include a stack structure of first unit modules 205a and second unit modules 205b. The first unit modules 205a may be disposed in odd-number layers and the second unit modules 205b may be disposed in even-number layers. The first unit modules 205a can include first unit substrates 210a and an interconnection structure thereof, and the second unit modules 205b can include second unit substrates 210b and an interconnection structure thereof.

The first unit substrates 210a and the second unit substrates 210b can be alternately stacked with respect to each other. For example, the first unit substrates 210a can be disposed first and then, the second unit substrates 210b and the first unit substrates 210a are sequentially alternately stacked. Each of the first and second unit substrates 210a and 210b can include a selection terminal 220. Furthermore, the first and second unit substrates 210a and 210b can include one or more input and output terminals 230. The technical features of the first and second unit substrates 210a and 210b may be substantially the same as those of the first and second unit substrates 110a and 110b which have been described with reference to FIGS. 1 through 3, except that unlike the first unit substrates 110a and second unit substrates 110b of FIG. 1, the first unit substrates 210a and the second unit substrates 210b may be aligned in a zigzag configuration First selection lines S1 and S3, second selection lines S2 and S4, and/or one or more input and output lines IO1 and IO2 can form an interconnection structure of the first unit modules 205a and second unit modules 205b. First selection lines S1 and S3 and second selection lines S2 and S4 can be understood with reference to the description of FIG. 1 through FIG. 3 above.

The input and output lines IO1 and IO2 can be commonly connected to the input and output terminals 230 of the first and second unit substrates 210a and 210b. The input and output lines IO1 and IO2 can be shared by the first and second unit substrates 210a and 210b. The input and output lines IO1 and IO2 can be vertically disposed so as to form a ladder-like structure.

Figure 7:
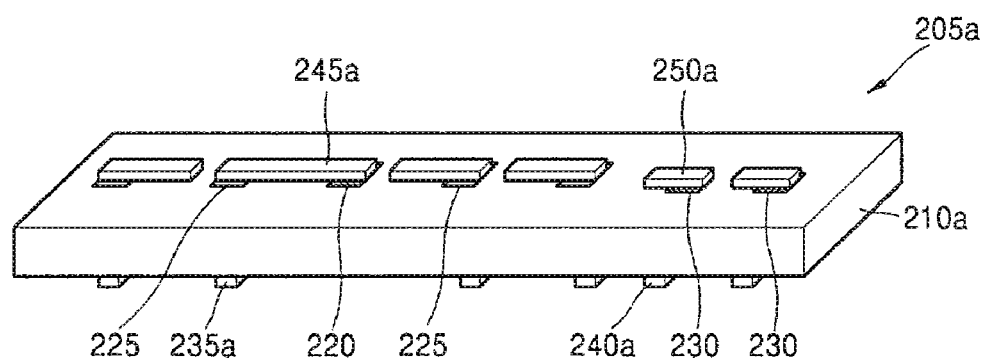
FIG. 7 shows a perspective view of an example of a first unit module alternatively arranged in the stack module of FIG. 6.
Figure 8:
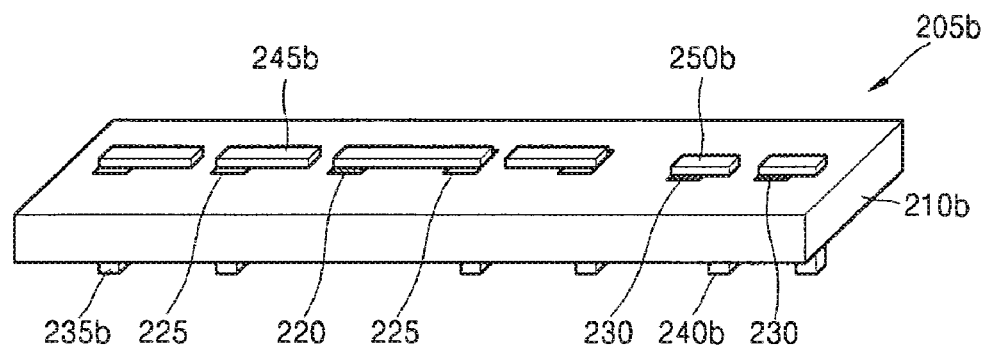
FIG. 8 shows a perspective view of an example of a second unit module alternatively arranged in the stack module of FIG. 6.

FIG. 7 shows a perspective view of an example of a first unit module alternatively arranged in the stack module of FIG. 6, and FIG. 8 shows a perspective view of an example of a first unit module alternatively arranged in the stack module of FIG. 6. FIG. 7 and FIG. 8 can respectively correspond to FIG. 2 and FIG. 3, and thus, a description of the elements in the present embodiment, which are similar to the elements in the stack module 100, will not be given.

Referring to FIG. 7, selection pads 225 can be disposed at both sides of a selection terminal 220 of a first unit substrate 210a. First through-hole electrodes 235a pass through the first unit substrate 210a, and can be disposed at both sides of the selection terminal 220. The number of selection pads 225 can be half the number of selection pads 125 of FIG. 2. For example, when the number of first through-hole electrodes 235a is N, the number of selection pads 225 can also be N.

First redistribution layers 245a can be disposed on first unit substrates 210a in such a manner that the first redistribution layers 245a are electrically connected to the first through-hole electrodes 235a. For example, the first redistribution layers 245a can extend from the first through-hole electrodes 235a toward the selection terminal 220 by a predetermined distance. Among the first redistribution layers 245a, one first redistribution layer 245a to the immediate left of the selection terminal 220 can directly contact the selection terminal 220.

The third through-hole electrodes 240a can pass through the first unit substrates 210a and can be connected to the input and output terminals 230. For example, the third redistribution layers 250a can be disposed on the first unit substrates 210a in such a manner that the third through-hole electrodes 240a are connected to the input and output terminals 230.

Referring to FIG. 8, the second through-hole electrodes 235b can be disposed at locations of the second unit substrates 210b corresponding to the first through-hole electrodes 235a.

Second redistribution layers 245b can be disposed on the second unit substrates 210b in such a manner that the second redistribution layers 245b are electrically connected to the second through-hole electrodes 235b, and extend toward the selection terminal 220 by a predetermined distance. Among the second redistribution layers 245b, a second redistribution layer 245b to the immediate right of the selection terminal 220 can directly contact the selection terminal 220.

The fourth through-hole electrodes 240b can pass through the second unit substrates 210b and can be connected to the input and output terminals 230. For example, the fourth redistribution layers 250b can be disposed on the second unit substrates 210b in such a manner that the fourth through-hole electrodes 240b are connected to the input and output terminals 230. The third through-hole electrodes 240a and the fourth through-hole electrodes 240b can be disposed in the first and second unit substrates 210a and 210b so as to have a ladder-like form.

Referring to FIGS. 6 through 8, two first unit modules 205a and two second unit modules 205b can be alternatively stacked to form the stack module 200. In this regard, the first unit substrates 210a and the second unit substrates 210b are alternately aligned whereby ends of adjacent substrates are spaced apart from each other by a predetermined distance. For example, the first unit substrates 210a and the second unit substrates 210b can be shifted by a half pitch of the first through-hole electrodes 235a or the second through-hole electrodes 235b.

Therefore, in the stack module 200, the first through-hole electrodes 235a and the second through-hole electrodes 235b can be disposed so as to have a ladder-like form. Therefore, the first selection lines S1 and S3 and the second selection lines S2 and S4 are similar to the structure illustrated in FIG. 1.

The input and output lines IO1 and IO2 can include a repeating unit including the third through-hole electrodes 240a, the third redistribution layers 250a, the fourth through-hole electrodes 240b and the fourth redistribution layers 250b, which are arranged to have a ladder-like form.

The stack module 200 according to the present embodiment has further advantages in addition to the advantages of the stack module 100 of FIG. 1. That is, before the first unit module 205a and the second unit module 205b are stacked, the first through-hole electrodes 235a and the second through-hole electrodes 235b can be formed at substantially the same location in the first unit substrate 210a and in the second unit substrate 210b, respectively. Therefore, the number of selection pads 225 of the first and second unit substrates 210a and 210b can be decreased. Thus, an internal circuit can be formed in a wider area in the first unit substrate 210a and the second unit substrate 210b. Specifically, as integration of the first and second unit substrate 210a and 210b is increased, it may be desirable to obtain a wider area for forming an internal circuit. Therefore, the stack module 200 is suitable for a highly integrated and high-speed device.

Figure 9:
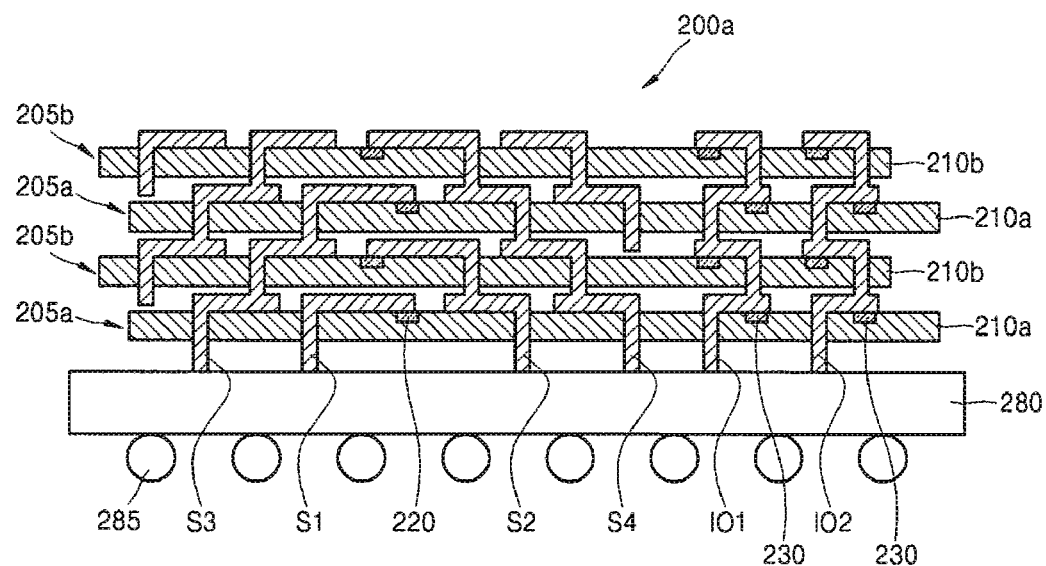
FIG. 9 shows a cross-sectional view of a stack module according to another embodiment of the present invention.

FIG. 9 shows a cross-sectional view of a stack module 200a according to another embodiment of the present invention.

Referring to FIG. 9, the stack module 200 of FIG. 8 can be mounted on a package substrate 280. The first selection lines S1 and S3, the second selection lines S2 and S4, and the input and output lines IO1 and IO2 can be connected to a circuit of the package substrate 280. A plurality of conductive bumps 285 can be arranged under the package substrate 280.

Figure 10:
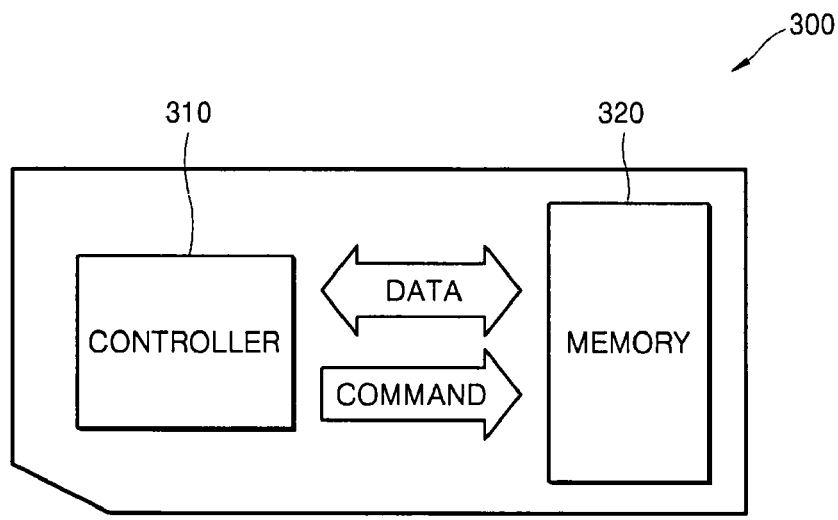
FIG. 10 shows a schematic view of a card according to an embodiment of the present invention.

FIG. 10 shows a schematic view of a memory card 300 according to an embodiment of the present invention.

Referring to FIG. 10, a controller 310 and a memory 320 can be disposed in such a manner that the controller 310 and the memory 320 exchange an electrical signal with each other. For example, when the controller 310 gives a command to request data, the memory 320 can transfer the data. The card 300 may be suitable for a memory device, such as a multi media card (MMC) or a secure digital (SD) card.

The memory 320 can correspond to any one of the stack modules 100, 100a, 100b, 200, and 200a of FIGS. 1 through 9. That is, the stack modules 100, 100a, 100b, 200, and 200a can include a memory device, such as dynamic random access memory (DRAM), static random access memory (SRAM), flash memory, and/or phase-change random access memory (PRAM).

Figure 11:
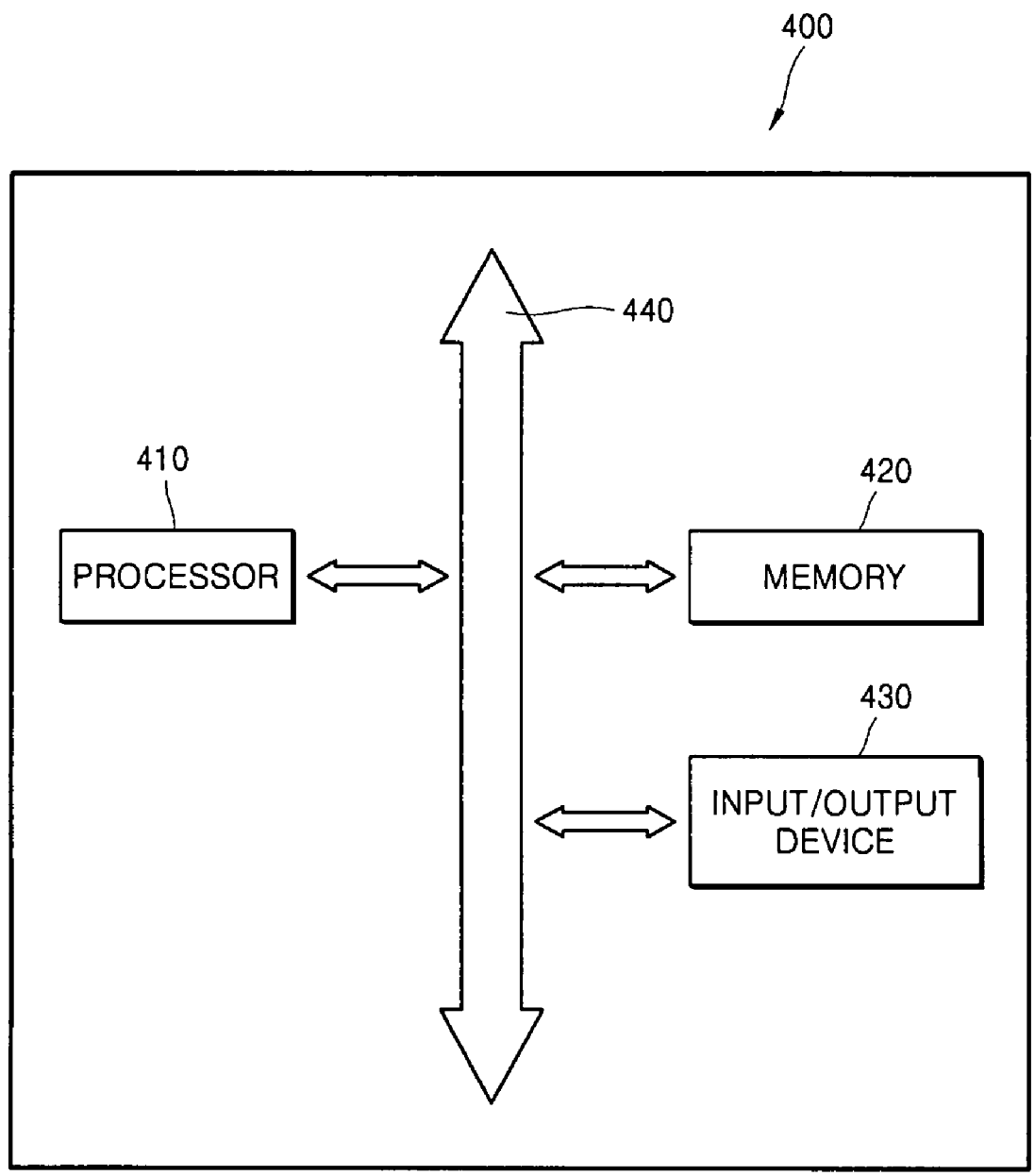
FIG. 11 shows a block diagram of a system according to an embodiment of the present invention.

FIG. 11 shows a block diagram of a system 400 according to an embodiment of the present invention.

Referring to FIG. 11, a processor 410, an input/output device 430, and a memory 420 can communicate data between each other using a bus 440. The processor 410 can perform a program and control the system 400. The input/output device 430 can input or output data of the system 400.

The memory 420 can correspond to any one of the stack modules 100, 100a, 100b, 200, and 200a of FIGS. 1 through 9. For example, the memory 420 can store a code and data required to operate the processor 410. Furthermore, the system 400 can be connected to an external device, such as a personal computer (PC) or network and can exchange data with the external device, by using the input/output device 430.

The system 400 may be suitable for mobile phones, MP3 players, navigation devices, solid-state disks (SSDs), household appliances, and the like.

Stack modules according to some embodiments of the present invention include a stack structure that can be formed only using two kinds of interconnection structures. For example, first unit modules can include one kind of identical interconnection structure, and second unit modules can include another kind of identical interconnection structure. Therefore, the manufacturing costs can be substantially decreased compared to when each of the first and second unit modules include different interconnection structures from each other.

Also, stack modules according to some embodiments of the present invention include first and second redistribution layers that can be formed on only one surface of the first and second unit substrates. Therefore, stack modules can be manufactured at low cost using simplified processes. Furthermore, even when the first and second unit substrates are warped, connection reliability of the first selection lines and second selection lines can be ensured.

Also, stack modules according to an embodiment of the present invention include a first unit substrate and a second unit substrate that require only a small number of selection pads. Therefore, an internal circuit can be formed in a wide area in the first unit substrate and the second unit substrate. Thus, the stack module according to the present invention may be suitable for a highly integrated and high-speed device.

According to an aspect of the present invention, there is provided a stack module comprising: a plurality of unit substrates stacked with respect to each other, each unit substrate comprising a selection terminal, wherein the plurality of unit substrates comprises at least one first unit substrate stacked in odd-numbered layers and at least one second unit substrate stacked in even-numbered layers; first selection lines electrically connected to selection terminals of the first unit substrates, the first selection lines penetrating at least one of the unit substrates and extending to a lowermost one of the unit substrates; and second selection lines electrically connected to selection terminals of the second unit substrates, the second selection lines penetrating at least one of the unit substrates and extending to the lowermost substrate, wherein each of the selection terminals is interposed between the first selection lines and the second selection lines.

According to an example of the stack module according to the present invention, the first selection lines and the second selection lines can extend from the selection terminal in a step-wise manner in an opposite direction with respect to each other.

According to another example of the stack module according to the present invention, the stack module includes N unit substrates and N or more first through-hole electrodes can pass through the first unit substrates and be disposed at both sides of the selection terminal of each of the first unit substrates. N or more first redistribution layers can be connected to the first through-hole electrodes and extend toward the selection terminal. N or more second through-hole electrodes can pass through the second unit substrates and can be disposed at both sides of the selection terminal of each of the second unit substrates. N or more second redistribution layers can be connected to the second through-hole electrodes and extend toward the selection terminal of each of the second unit substrates. The first selection lines and the second selection lines include at least two selected from the group consisting of the first through-hole electrodes, the second through-hole electrodes, the first redistribution layers, and the second redistribution layers.

According to another example of the stack module according to the present invention, ends of the first unit substrates and the second unit substrates align with each other, the second through-hole electrodes can be disposed in the second unit substrates such that the second through-hole electrodes and the first through-hole electrodes are arranged to form a ladder-like structure.

According to another example of the stack module according to the present invention, the first through-hole electrodes and the second through-hole electrodes are respectively disposed in the same location in the first unit substrates and the second unit substrates, and the first unit substrate and the second unit substrate are aligned in a zigzag configuration.

According to another aspect of the present invention, there is provided a card including a memory and a controller. The memory can include the stack module. The controller controls the memory and exchanges data with the memory.

According to another aspect of the present invention, there is provided a system including a memory and a processor. The memory includes the stack module. The processor communicates with the memory through a bus.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A stack module comprising:
   a plurality of unit substrates stacked with respect to each other, each unit substrate comprising a selection terminal, wherein the plurality of unit substrates comprises at least one first unit substrate stacked in odd-numbered layers and at least one second unit substrate stacked in even-numbered layers;
   first selection lines electrically connected to selection terminals of the first unit substrates, the first selection lines penetrating at least one of the unit substrates and extending to a lowermost one of the unit substrates; and
   second selection lines electrically connected to selection terminals of the second unit substrates, the second selection lines penetrating at least one of the unit substrates and extending to the lowermost substrate, wherein each of the selection terminals is interposed between the first selection lines and the second selection lines.

2. The stack module of claim 1, wherein the first selection lines and the second selection lines extend from the selection terminals in a step-wise manner in opposite directions with respect to each other.

3. The stack module of claim 1, wherein portions of the first and second selection lines which pass through the first unit substrates are vertically aligned.

4. The stack module of claim 1, wherein portions of the first and second selection lines which pass through the second unit substrates are vertically aligned.

5. The stack module of claim 1, wherein the stack module comprises N unit substrates and wherein:
   N or more first through-hole electrodes pass through the first unit substrates and are disposed at both sides of the selection terminal of each of the first unit substrates;
   N or more first redistribution layers are connected to the first through-hole electrodes and extend toward the selection terminal;
   N or more second through-hole electrodes pass through the second unit substrates and are disposed at both sides of the selection terminal of each of the second unit substrates; and
   N or more second redistribution layers are connected to the second through-hole electrodes and extend toward the selection terminal of each of the second unit substrates.

6. The stack module of claim 5, wherein the first redistribution layers are disposed on the first unit substrates and the second redistribution layers are disposed on the second unit substrates.

7. The stack module of claim 5, wherein portions of the first through-hole electrodes are connected to portions of the second redistribution layers, and portions of the second through-hole electrodes are connected to portions of the first redistribution layers.

8. The stack module of claim 5, wherein, when N is an even number, N/2 first through-hole electrodes are disposed at one side of each of the selection terminals and N/2 second through-hole electrodes are disposed at another side of each of the selection terminals.

9. The stack module of claim 5, wherein, when N is an odd number, (N+1)/2 first through-hole electrodes are disposed at one side of each of the selection terminals and (N+1)/2 second through-hole electrodes are disposed at another side of each of the selection terminals.

10. The stack module of claim 5, wherein ends of the first unit substrates and the second unit substrates are aligned with each other, and the second through-hole electrodes are disposed in the second unit substrates such that the second through-hole electrodes and the first through-hole electrodes are alternately arranged.

11. The stack module of claim 10, wherein each of the second through-hole electrodes is disposed at a central portion of adjacent first through-hole electrodes.

12. The stack module of claim 5, wherein the first unit substrates and the second unit substrates are aligned in a zigzag configuration.

13. The stack module of claim 12, wherein the second unit substrates and the first unit substrates are aligned in a zigzag configuration by a half pitch of the first through-hole electrodes and the second through-hole electrodes.

14. The stack module of claim 1, wherein the plurality of unit substrates further include one or more input and output terminals.

15. The stack module of claim 14, further comprising one or more input and output lines which pass through the plurality of unit substrates such that one or more input and output terminals of respective unit substrates are commonly connected.

16. The stack module of claim 15, wherein the one or more input and output lines pass through the one or more input and output terminals.

17. The stack module of claim 15, wherein the first unit substrates and the second unit substrates are aligned in a zigzag configuration, and the one or more input and output lines are vertically arranged so as to have a ladder-like form.

18. The stack module of claim 1, further comprising a package substrate disposed below the plurality of unit substrates, and wherein the first selection lines and the second selection lines are electrically connected to the package substrate.

19. The stack module of claim 18, further comprising one or more conductive bumps mounted to the package substrate.

20. The stack module of claim 1, wherein each of the plurality of unit substrates comprises a semiconductor chip.

21. A card comprising:
a memory comprising the stack module of claim 1; and
a controller which controls the memory and exchange of data of the memory.

22. A system comprising:
a memory comprising the stack module of claim 1; and
a processor communicating with the memory through a bus.

23. The system of claim 22, further comprising an input and output device communicating with the bus.

* * * * *